United States Patent [19]
Kudo

[11] Patent Number: 5,780,874
[45] Date of Patent: Jul. 14, 1998

[54] PROCESS FOR FORMING FLUORINATED RESIN OR AMORPHOUS CARBON LAYER AND DEVICES CONTAINING SAME

[75] Inventor: Hiroshi Kudo, Kawasaki, Japan

[73] Assignee: Fujitsu Limited, Kawasaki, Japan

[21] Appl. No.: 744,072

[22] Filed: Nov. 4, 1996

Related U.S. Application Data

[62] Division of Ser. No. 107,167, Aug. 17, 1993, Pat. No. 5,599,654.

[30] Foreign Application Priority Data

Aug. 21, 1992 [JP] Japan ................................. 4-222893

[51] Int. Cl.$^6$ ................................................ H01L 31/0312
[52] U.S. Cl. ........................... 257/77; 257/642; 257/646
[58] Field of Search ................................. 257/642, 643, 257/632, 77, 646, 759

[56] References Cited

U.S. PATENT DOCUMENTS 4,908,198  3/1990  Weinberg ........................ 423/415 R
5,387,495  2/1995  Lee et al. ........................... 430/315

FOREIGN PATENT DOCUMENTS

| 58-91728 | 5/1983 | Japan . |
| 63-662237 | 3/1988 | Japan . |
| 3-62792 | 9/1991 | Japan . |
| 4-112527 | 4/1992 | Japan . |
| 4-276622 | 10/1992 | Japan . |

OTHER PUBLICATIONS

H.Y. Lu et al., J. vac. Sci. Technol. A. vol. 10, No. 3, 450 (1992).

R.J. Lagow et al. Polymer Letters Edition, vol. 12, pp. 177–184 (1984).

*Primary Examiner*—Sara W. Crane
*Attorney, Agent, or Firm*—Armstrong, Westerman, Hattori, McLeland & Naughton

[57] ABSTRACT

A resin or amorphous carbon layer is coated on a substrate and then fluorinated by exposing it in a $F_2$ gas atmosphere. The thus fluorinated resin or amorphous carbon layer can be excellent in dielectric constant and thermal resistance. The resin may be photo-sensitive so that the resin can be patterned before the fluorination. Alternatively, the resin can be fluorinated before patterning.

2 Claims, 4 Drawing Sheets

PROCESS FOR FORMING FLUORINATED RESIN OR AMORPHOUS CARBON LAYER AND DEVICES CONTAINING SAME

This is a division of application Ser. No. 08/107,167 filed Aug. 17, 1993, now U.S. Pat. No. 5,599,654.

BACKGROUND OF THE INVENTION

1. Field of the Invention

The present invention relates to a process for forming a pattern of a fluorinated resin or amorphous carbon layer, more specifically to a process for forming an insulating layer in multi-layer wiring boards for semiconductor devices and multi-chip modules (MCM).

2. Description of the Related Art

Due to an increase in the integration degree and operation speed of semiconductor devices and MCMS, the insulating materials used in multi-layer wiring boards are being reconsidered. At the present time, $SiO_2$ is used as the insulating material for semiconductor devices and polyimide is used as the insulating material for MCMs. Since these insulating materials have high dielectric constants, 4.0 (at 1 MHz) of $SiO_2$ and 3.5 (at 1 MHz) of polyimide, the problems of the wiring signal propagation delay (wiring delay) and crosstalk are worsened. The wiring delay t is represented by $t=\sqrt{\epsilon}/C$ where $\epsilon$ denotes the dielectric constant of an insulating material for a signal line and C denotes the speed of light and the wiring delay is elongated in relation to the square root of the dielectric constant of the insulating material. Accordingly, an insulating material having a low dielectric constant is necessary to shorten the wiring delay. The crosstalk is caused by the parasitic capacitance between wiring layers. An insulating material having a low dielectric constant is also necessary to lower the parastic capacitance. Benzocyclobutane (BCB) has been proposed to replace $SiO_2$ and polyimide, but this still has a high dielectric constant of 2.70 (at 1 MHz).

Fluorine-based or -containing resins or polymers are promising as an insulating material for wiring layers since they have a low dielectric constant. For example, polytetrafluoroethylene (P-TFE) has a dielectric constant of 2.2 (at 1 MHz), the lowest among organic materials.

The fluorine-containing resins or polymers are however difficult to form into a layer or film since they are not soluble in most solvents and therefore cannot be coated as is done for normal photo-sensitive resins. Some fluorine-containing resins which can be spin coated are commercially available, but these have poor adhesion to a substrate and are easily peeled off when heated. JP-A-3-80541, published in April 1991, discloses a process for forming a fluorine-containing resin layer, but this layer does not have a sufficient adhesion to a substrate.

There is a report in that if a P-TFE layer is deposited by plasma enhanced polymerization, the obtained layer has a high adhesion to a substrate. Nevertheless, the plasma polymerized P-TFE layer contains unsaturated carbon bonds and carbon radicals, so that the layer has a poor thermal resistance and does not have a low dielectric constant (about 2.8 at 1 MHz was reported). JP-B-3-62792, published in September, 1991, proposes a process of lowering the content of the unsaturated carbon bonds and carbon radicals by exposing a deposited carbon-containing layer to a fluorine-containing plasma gas (see also U.S. Pat. No. 4,902,529). In this process, however, only a thin surface region (about 0.30 μm thick) of the layer can be fluorinated and C—C bonds may also be cleaved by fluorine radicals, so that the resulting layer is not a sufficient fluorinated layer with a high thermal resistance.

The object of the present invention is to provide a process for forming a fluorinated resin or amorphous carbon layer which can be advantageously applied as an insulating layer for wiring layers in semiconductor devices and MCMs.

SUMMARY OF THE INVENTION

To attain the above object, the present invention provides a process for forming a pattern of a fluorinated resin layer on a substrate, comprising the steps of: forming a photo-sensitive resin layer on a substrate, selectively exposing the photo-sensitive resin layer to a high energy ray, developing the selectively exposed photo-sensitive resin layer to form a pattern of the resin layer, and exposing the pattern of the resin layer to a fluorine gas atmosphere to convert the pattern of the resin layer to the pattern of a fluorinated resin layer on the substrate.

The present invention also provides a process for forming a pattern of a fluorinated resin layer on a substrate, comprising the steps of: forming a photo-sensitive resin layer on a substrate, selectively exposing the photo-sensitive resin layer to a high energy ray, exposing the resin layer to a fluorine gas atmosphere to convert the resin layer to a fluorinated resin layer, and developing the fluorinated resin layer to form a pattern of the fluorinated resin layer on the substrate.

The present invention further provides a process for forming a pattern of a fluorinated resin layer on a substrate, comprising the steps of: forming a resin layer on a substrate, exposing the resin layer to a fluorine gas atmosphere to convert the resin layer to a fluorinated resin layer, and patterning the fluorinated resin layer to obtain a pattern of the fluorinated resin layer on the substrate.

The present invention further provides a process for forming a pattern of a fluorinated resin layer on a substrate, comprising the steps of: forming a resin layer on a substrate, patterning the resin layer to form a pattern of the resin layer on the substrate, and exposing the pattern of the resin layer to convert the pattern of the resin layer to a pattern of a fluorinated resin layer on the substrate.

The present invention further provides as process for forming a pattern of a fluorinated amorphous carbon layer on a substrate, comprising the steps of: forming an amorphous carbon layer on a substrate, exposing the amorphous carbon layer to a fluorine gas atmosphere to convert the amorphous carbon layer to a fluorinated amorphous carbon layer, and patterning the fluorinated amorphous carbon layer to obtain a pattern of the fluorinated amorphous carbon layer on the substrate.

The present invention further provides-a process for forming a pattern of a fluorinated amorphous carbon layer on a substrate, comprising the steps of: forming an amorphous carbon layer on a substrate, patterning the amorphous carbon layer to form a pattern of the amorphous carbon layer on the substrate, and exposing the pattern of the amorphous carbon layer to convert the pattern of the amorphous carbon layer to a pattern of a fluorinated amorphous carbon layer on the substrate.

The present invention also provides a semiconductor device comprising a semiconductor substrate and a wiring structure provided over the semiconductor substrate, the wiring structure comprising a first insulating layer of a first resin, an electrically conductive layer on the first insulating layer, and a second insulating layer of a second resin on the electrically conductive layer, wherein at least one of the first and second resins is fluorinated in a major portion of the layer except for a thin region adjacent to the bottom thereof.

Typically, a second electrically conductive layer is further formed on the second insulating layer.

The present invention further provides a multi-layer wiring board, comprising a substrate, an electrically conductive layer on the substrate, and an insulating layer of a resin on the electrically conductive layer, wherein the resin is fluorinated in a major portion thereof except for a thin region adjacent to the electrically conductive layer.

The present invention also provides a semiconductor device comprising a semiconductor substrate and a wiring structure provided over the semiconductor substrate, the wiring structure comprising a first insulating layer of a first amorphous carbon, an electrically conductive layer on the first insulating layer, and a second insulating layer of a second amorphous carbon on the electrically conductive layer, wherein least one of the first and second amorphous carbons is fluorinated in a major portion of the layer except for a thin region adjacent to the bottom thereof. Typically, a second electrically conductive layer is further formed on the second insulating layer.

The present invention further provides a multi-layer wiring board, comprising a substrate an electrically conductive layer on the substrate, and an insulating layer of an amorphous carbon on the electrically conductive layer, wherein the amorphous carbon is fluorinated in a major portion thereof except for a thin region adjacent to the electrically conductive layer.

The resins or polymers that can be used in the present invention are hydrocarbons that have a skeleton of carbon and side chains comprised of carbon and hydrogen and optionally halogen. The resins or polymer may include functional groups. The resins or polymers may further include other atoms or groups in a minor amount that does not deteriorate the desired properties of the fluorinated resin layer.

Examples of such resins or polymers include polyethylene-based, polypropylene-based, ethylenepropylene copolymer-based, polystyrene-based, polyacrylonitrile-based, polyacrylamide-based, phenolformamide-based, vinyl-based, ether-based, methacrylic-based and crylic-based resins and halogen-containing resins thereof.

The resins (or polymers) may or may not be photo-sensitive. If the resins are photo-sensitive, the resins or polymers are first coated and locally exposed to light, followed by fluorination of the coated resin layer. The development of the exposed resin layer may be either before or after the fluorination. If the resins (or polymers) are not photo-sensitive, the resins are first coated and fluorinated, followed by patterning the obtained fluorinated resin layer.

The resins or polymers generally have a molecular weight of more than about 3000. If the molecular weight of the resins or polymers is smaller than this, a coated layer having a high thermal resistance and a high adhesion to the underlying layer cannot be obtained.

The fluorination of the coated resin or amorphous carbon layer is performed by exposing the coated resin layer in a fluorine gas atmosphere without plasma. It is critical in the present invention that the fluorine gas atmosphere does not involve plasma. If plasma is present, the coated resin or amorphous carbon layer is disadvantageously damaged (the carbon skeleton is also cleaved). The atmosphere may contain a carries gas such as nitrogen or inert gas. The content of fluorine is generally less than 30%, preferably 1 to 10%, more specifically around 5%.

The pressure of the atmosphere may be conveniently atmospheric pressure but may be under pressure or vacuum, it necessary.

The temperature for the fluorination treatment is preferably as high as possible but should be lower than a temperature at which the coated resin or amorphous carbon layer is softened. The softening temperature of a resin depends on the type of resin but is typically 100° to 200° C. Accordingly, a temperature of 50° to 100° C., more preferably 60° to 70° C., is generally preferable.

In the fluorination, it is intended and preferred that the resin is completely fluorinated, i.e., all side chain atoms or groups other than carbon are substituted by fluorine, but some atoms or groups other than fluorine may remain in a minor amount.

Furthermore, the coated resin or amorphous carbon layer should be preferably fluorinated in essentially all its thickness except for a thin region adjacent to the bottom of the layer. To obtain a low dielectric resistance, the resin or amorphous carbon should be fluorinated as much as possible. Nevertheless, if the resin or amorphous carbon layer is completely fluorinated to the bottom thereof, the adhesion of the coated resin or amorphous carbon layer to the underlying layer is disadvantageously lowered. Accordingly, a very thin region adjacent to the bottom of the coated resin or amorphous carbon layer should remain unfluorinated. Typically, a thickness of only a few tens to one hundred angstroms of the unfluorinated resin or amorphous carbon portion is sufficient for the above purpose.

The fluorination treatment time should be determined to provide a desired degree of fluorination considering the type of resin or amorphous carbon and fluorination conditions. In an example, a thickness of 1 μm was fluorinated by a treatment at 70° C. for 3 hours.

By the fluorination, C—H and C—X bonds are substituted by C—F bonds and fluorines are bonded to unsaturated carbon bonds; and fluorines are bonded to amorphous carbons, so that a coated fluorinated resin or amorphous carbon layer can be obtained.

The patterning can be carried out using conventional processes.

[EXAMPLES]

Example 1

Both sides of a silicon substrate were coated with aluminum by sputtering, in order to prevent reaction of silicon with a fluorine gas. A cyclic rubber resist OMR, produced by Tokyo Oka, was spin coated on the substrate and baked at 100° C. for 1 minute.

Figure 1:
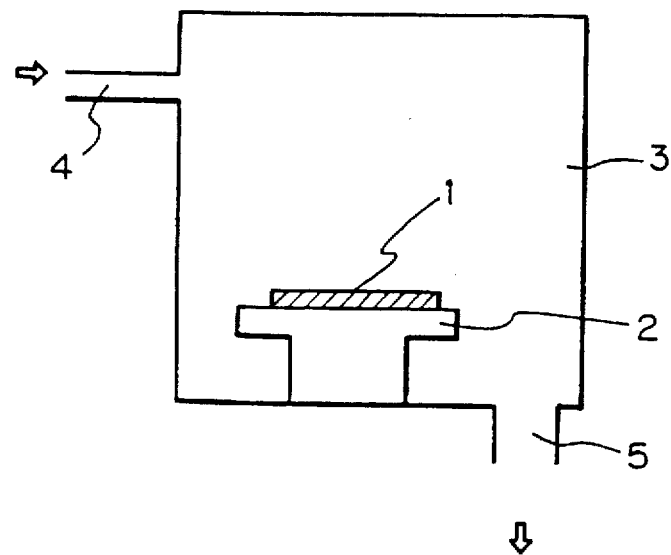
FIG. 1 shows a $F_2$ gas treatment apparatus.

Referring to FIG. 1, the coated substrate 1 was set on a support 2 in a reaction chamber 3 having an inlet 4 and an outlet 5. The reaction chamber 3 was evacuated to $10^{-4}$ Torr and a gas flow of a 5% $F_2$ gas diluted with $N_2$ was then passed through the reaction chamber 3 to atmospheric pressure. The substrate was heated to 70° C. and the fluorination was carried out for 3 hours.

OMR comprises 1,4-cis-isoprene units some of which are made cyclic. The 1,4-cis-isoprene unit and cyclic unit thereof are shown below:

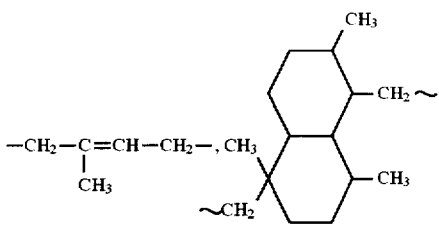

In the fluorination, C—H bonds were changed to C—F bonds and unsaturated carbon bonds were saturated with fluorine, as shown in the following formulae:

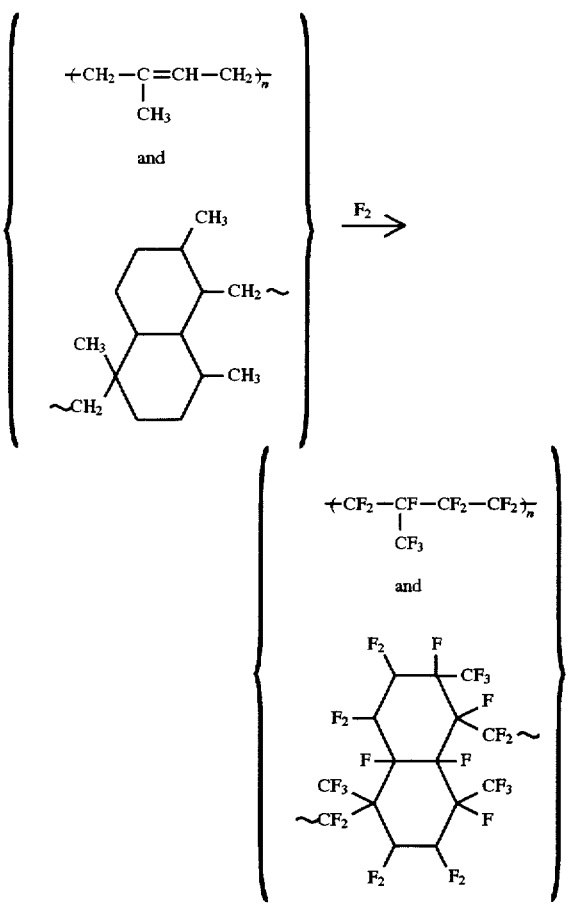

The fluorination can be confirmed by an infra-red (IR) spectrum. It was seen in the IR spectrum that absorptions based on C—H bond around 2930 cm$^{-1}$ disappeared after the above reaction and absorptions based on C—F bond around 1250 cm$^{-1}$ appeared.

The obtained fluorinated resin layer had a dielectric constant of 2.1 at 1 MHz, which is equivalent to that of polytetrafluoroethylene (PTFE).

Figure 2:
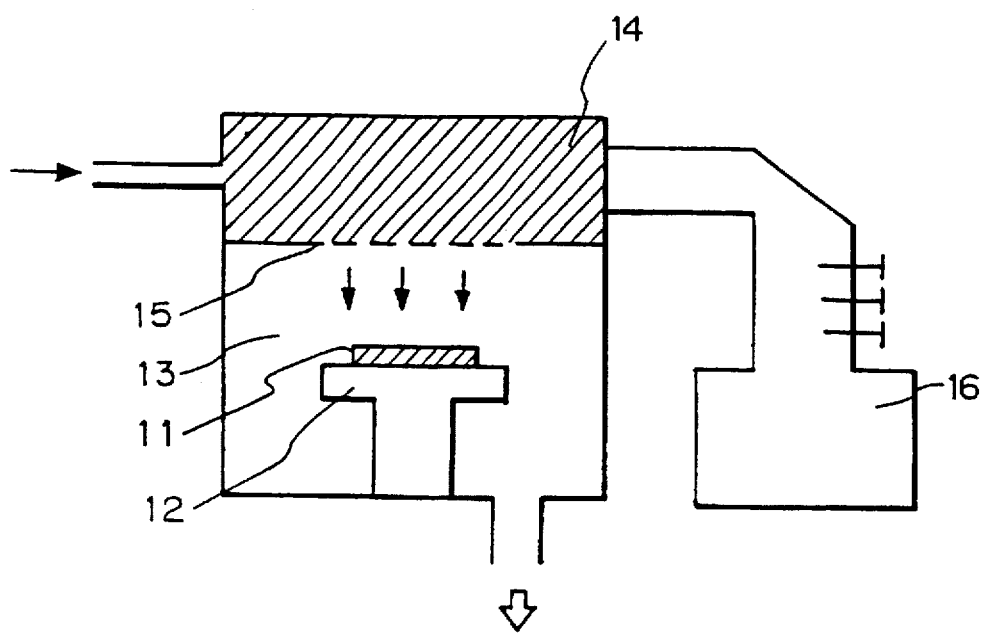
FIG. 2 shows a downstream type plasma treatment apparatus used in the prior art.

For comparison, a fluorination of a resin layer by fluorine plasma was carried out. A downstream type plasma treatment apparatus as shown in FIG. 2 was used. If a common parallel plane type plasma treatment apparatus is used, accelerated ions or electrons damage the substrate and the coated resin is decomposed. So, the downstream type apparatus was used. The resin coated substrate 11, which was identical to one used in the above description, was set on a support 12 in a reaction chamber 13 which communicated with a plasma chamber 14 through a microwave shielding plate 15. The reaction chamber 13 was evacuated to $10^{-4}$ Torr and a gas flow of a $NF_3$ gas was supplied at 500 cc/min to make the pressure in the plasma and reaction chamber 5.0 Torr. A microwave with 1 GHz and 1.5 kW was supplied from a magnetron 16 to generate plasma in the plasma chamber 14. Since the microwave shielding plate 15 was electrically grounded, only neutral F radicals and molecules diffuse into the reaction chamber 13. The substrate 11 was heated to 70° C. and fluorination was carried out for 1 hour.

The fluorination was confirmed by the IR spectrum in the same manner as described above.

The obtained fluorinated resin layer had a dielectric constant of 2.1 at 1 MHz.

Figure 3:
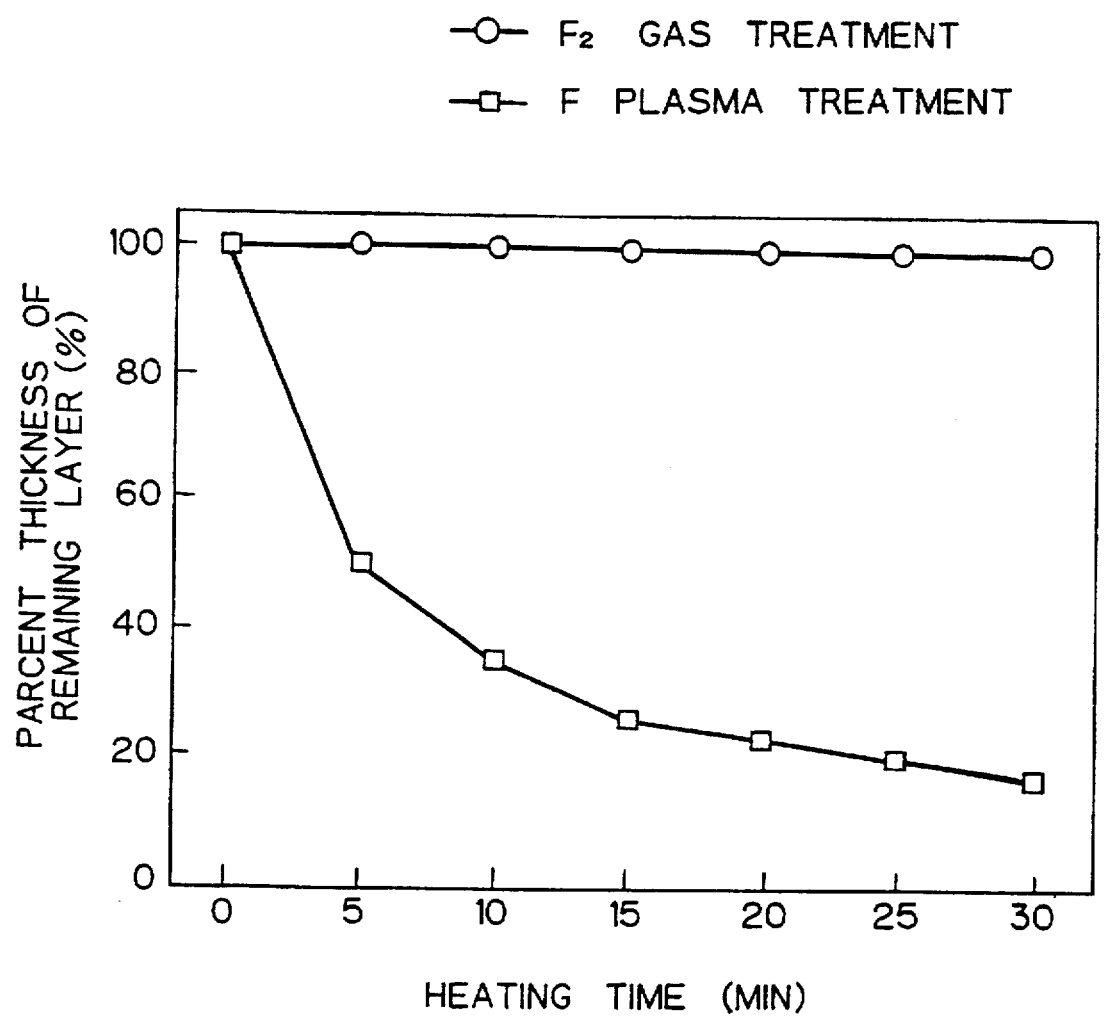
FIG. 3 shows the thickness of a remaining layer after heat treatment.

The thus obtained two fluorinated resin layers were heated in air at 400° C. and the percentage of remaining layer thickness in relation to the heating time period is shown in FIG. 3.

It is seen in FIG. 3 that the thickness of the fluorinated resin layer treated in a fluorine gas atmosphere was not decreased even after heating for 30 minutes. It is known that a PTFE layer is peeled off by the heating as above, but such a peeling off did not occur in the above example. The reason is considered to be because a portion of the resin layer adjacent to the substrate remained unfluorinated and therefore the resin layer maintained a high adhesion to the substrate. In fact, when the conditions for the fluorination were made more severe, the resin layer tended to be easily peeled off.

It is also seen in FIG. 3 that the thickness of the fluorinated resin layer treated in fluorine plasma was significantly decreased soon after being heated. Thus, the plasma treated fluorinated resin layer has a low thermal resistance, so that it is not suitable to be used as an insulating layer in MCMs or semiconductor devices, since heat treatments up to about 400° C. are adopted in processes for manufacturing MCMs or semiconductor devices.

In place of OMR, many other hydrocarbon-based resins may be fluorinated by the process of the present invention to provide a heat resistant fluorinated resin layer having a low dielectric constant. Such hydrocarbon-based resins include polyethylene, polypropylene, polystyrene, polyacrylonitrile, polyacrylamide, ethylene-propylene copolymer, phenolic formamide, vinyl, ether, acrylic, methacrylic-based resins and halogen-containing resins of the above resins.

Example 2

FIGS. 4A to 4G are referred to.

Figure 4A:
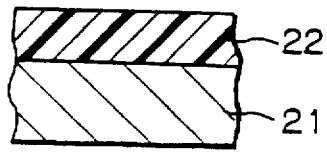
FIGS. 4A to 4G are section views of a semiconductor device in the main steps of manufacturing the same.

Referring to FIG. 4A, a photo-sensitive resist OMR was coated on a substrate 21 that was similar to the substrate used in Example 1. The coated resist layer 22 had a thickness of 1 μm and baked at 100° C. for 1 minute.

Figure 4B:
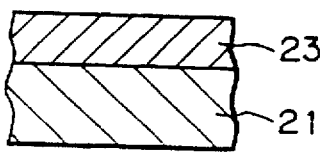

Referring to FIG. 4B, the coated OMR layer 22 was fluorinated in the same manner as described in Example 1 to obtain a first fluorinated resin layer 23.

Figure 4C:
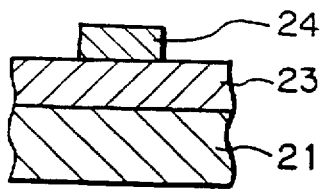

Referring to FIG. 4C, aluminum was sputtered on the fluorinated resin layer 23 and patterned to obtain a first aluminum wiring layer 24 with a thickness of 0.6 μm. The surface of the fluorinated resin layer 23 may be sputtered with argon to improve the adhesion of aluminum to the layer 23.

Figure 4D:
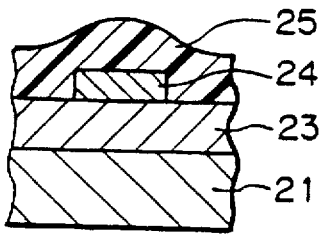

Referring to FIG. 4D, an OMR layer 25 was spin coated to a thickness of 1 μm and baked at 100° C. for 1 minute.

Figure 4E:
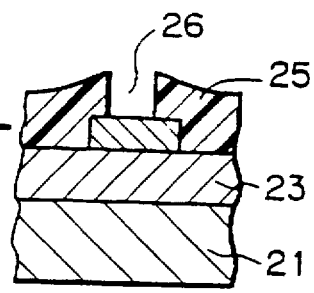

Referring to FIG. 4E, the OMR layer 25 was locally exposed to light with a mask pattern (not shown) and then developed. A through hole 26 was opened with a diameter of 1.0 μm.

Figure 4F:
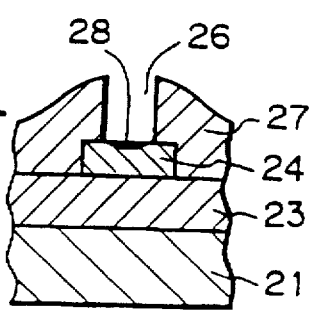

Referring to FIG. 4F, the patterned OMR layer was fluorinated in the same manner as described in Example 1 to obtain a second fluorinated resin layer 27. By this treatment, the exposed aluminum in the through hole 26 was also fluorinated to AlF 28.

Figure 4G:
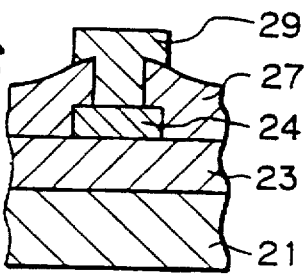

The AlF 28 was removed by Ar sputtering. Referring to FIG. 4G, aluminum was deposited by sputtering and patterned to form a second aluminum wiring layer 29 with a thickness of 0.6 μm.

Thus, a multi-layer wiring structure of a semiconductor device was obtained. This process can be also applied to a multi-layer wiring layers of a MCM.

In the above process, if exposure of the first aluminum layer 24 to a fluorine gas atmosphere is to be avoided, the fluorination step can be performed after the exposure of the OMR layer 25 to light and before the development of the exposed OMR layer 25.

Example 3

This Example is similar to Example 2, but the used resin layers were replaced by amorphous carbon (α-carbon) layers deposited by plasma polymerization.

FIGS. 5A to 5G are referred to.

Figure 5A:
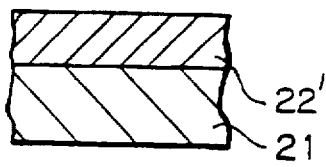
FIGS. 5A to 5G are sectional views of another semiconductor device in the main steps of manufacturing the same.

Referring to FIG. 5A, on a silicon substrate 21 similar to that in Example 1, an a-carbon layer 22' was deposited to a 0.5 μm thickness by plasma polymerization using a parallel plane type plasma apparatus under the following conditions.

| Pressure: | 0.1 Torr |
| --- | --- |
| RF power (13.56 MHz): | 100 W |
| Temperature of substrate: | 400° C. |
| Suppy gas: | (10% C$_2$H$_2$ diluted with He) +Ar |
| Flow rate: | |
| 10% C$_2$H$_2$ diluted with He | 300 sccm |
| Ar | 300 sccm |

Figure 5E:
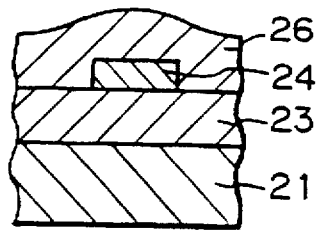
Figure 5B:
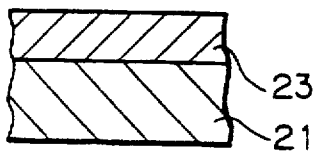

Referring to FIG. 5B, the α-carbon layer 22' was fluorinated in the same manner as in Example 1 to obtain a fluorinated carbon layer 23 as a first insulating layer.

Figure 5F:
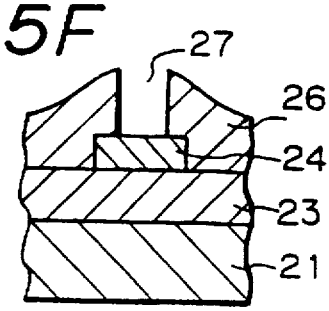
Figure 5C:
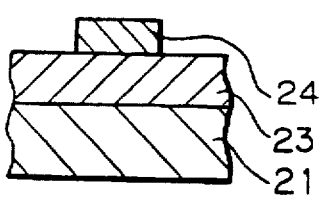

Referring to FIG. 5C, aluminum was deposited to a thickness of 0.4 μm and patterned to obtain a first aluminum wiring layer 24.

Figure 5G:
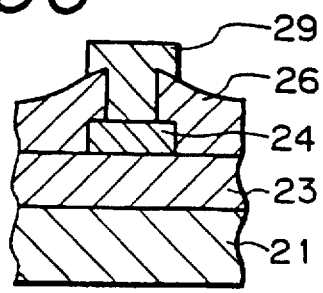
Figure 5D:
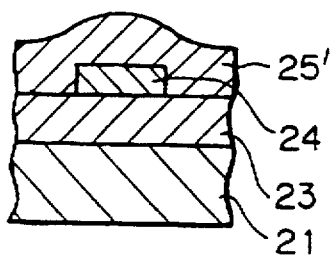

Referring to FIG. 5D, an α-carbon layer 25' was deposited in the same manner as above.

Referring to FIG. 5E, the α-carbon layer 25' was fluorinated in the same manner as in Example 1 to obtain a fluorinated carbon layer 26 as a second insulating layer.

Referring to FIG. 5F, a patterning of the second insulating layer 26 was performed to open a through hole 27. The etching of the second insulating layer 26 for patterning was performed with a mixed gas of CF$_4$ and O$_2$.

Referring to FIG. 5G, aluminum was deposited by sputtering and patterned to obtain a second aluminum wiring layer 29 with a thickness of 0.4 μm.

Although the α-carbon layer 25' was first fluorinated followed by patterning in the above example, the α-carbon layer can be first patterned followed by fluorination.

Example 4

This Example is similar to Example 2, but utilizes an excimer laser resist of polyvinylphenol (PVP). FIGS. 4A to 4G are again referred to.

Referring to FIG. 4A, on a substrate 21 similar to that in Example 1, PVP was spin coated to a thickness of 1.0 μm and baked at 100° C. for 1 minute to form a PVP layer 22.

Referring to FIG. 4B, the PVP layer 22 was fluorinated in the same manner as in Example 1 to form a first insulating layer 23.

Referring to FIG. 4C, aluminum was deposited and patterned to form a first aluminum wiring layer 24 with a thickness of 0.6 μm. The surface of the first insulating layer 23 may be sputtered with Ar before the deposition of aluminum, to improve the adhesion of the aluminum with the layer 23.

Referring to FIG. 4D, PVP was spin coated to a thickness of 1.0 μm and baked at 100° C. for 1 minute to form a PVP layer 25.

Referring to FIG. 4E, the PVP layer 25 was selectively exposed to light with a mask pattern and developed to open a through hole 26.with a diameter of 0.4 μm.

Referring to FIG. 4F, the patterned PVP layer 25 was fluorinated in the same manner as in Example 1 to obtain a second insulating layer 27. The aluminum exposed in the through hole 26 was also fluorinated to form AlF 28. The AlF 28 was removed by Ar sputtering.

Referring to FIG. 4G, aluminum was deposited by sputtering to a thickness of 0.6 μm and patterned to form a second aluminum wiring layer 29.

I claim:

1. A semiconductor device comprising a semiconductor substrate and a wiring structure provided over the semiconductor substrate, said wiring structure comprising a first insulating layer of a first resin, an electrically conductive layer on the first insulating layer, and a second insulating layer of a second resin on the electrically conductive layer, wherein at least one of said first and second resins is fluorinated in a major portion of the layer except for a thin region adjacent to the bottom thereof.

2. A semiconductor device comprising a semiconductor substrate and a wiring structure provided over the semiconductor substrate, said wiring structure comprising a first insulating layer of a first amorphous carbon, an electrically conductive layer on the first insulating layer, and a second insulating layer of a second amorphous carbon on the electrically conductive layer, wherein at least one of said first and second amorphous carbons is fluorinated in a major portion of the layer except for a thin region adjacent to the bottom thereof.

\* \* \* \* \*